United States Patent [19]

Jaber et al.

[11] Patent Number: 5,614,838
[45] Date of Patent: Mar. 25, 1997

[54] REDUCED POWER APPARATUS AND METHOD FOR TESTING HIGH SPEED COMPONENTS

[75] Inventors: Talal K. Jaber, Austin; Steven A. Schmidt, Leander, both of Tex.

[73] Assignee: International Business Machines Corporation, Armonk, N.Y.

[21] Appl. No.: 552,661

[22] Filed: Nov. 3, 1995

[51] Int. Cl.$^6$ .............................. G04F 4/00; G01R 31/28
[52] U.S. Cl. .............................. 324/765; 371/61; 324/601
[58] Field of Search ................................. 324/765, 601, 324/73.1, 72.5, 187, 188, 63, 61; 327/292; 307/219, 269, 271; 358/74; 371/61

[56] References Cited

U.S. PATENT DOCUMENTS 5,517,109  5/1996  Albean et al. ........................ 324/765

*Primary Examiner*—Ernest F. Karlsen
*Assistant Examiner*—Barry C. Bowser
*Attorney, Agent, or Firm*—Jenkens & Gilchrist

[57] ABSTRACT

A system for testing a high speed integrated circuit includes a test device having a test clock with a first maximum frequency for performing level sensitive scan design (LSSD) testing of the integrated circuit device under test, a frequency multiplier circuit for multiplying the test clock signal to a higher second frequency capable of operating the device under test, and a finite state machine for generating a first internal clock for testing the device under test. In a practical embodiment, the internal clock speed may be running at a frequency many multiples of the test clock. Alternatively, a method of testing a device under test (DUT) at design speed includes running a predetermined group of tests with a test device operating at a lower speed than the design speed; incorporating LSSD or boundary scan test techniques in the device under test, together with a frequency multiplying device; generating a global clock for the device under test from the frequency multiplying circuit and using a finite state machine as a synchronizer and pulse generator to control a capture clock with respect to the global clock.

9 Claims, 5 Drawing Sheets

REDUCED POWER APPARATUS AND METHOD FOR TESTING HIGH SPEED COMPONENTS

BACKGROUND OF THE INVENTION

1. Technical Field of the Invention

The present invention relates to apparatus and method for testing electronic components, and more particularly to apparatus and method for testing high speed components by test apparatus which reduces power dissipation in the electronic component during testing.

2. Prior Art

In the prior art there are many techniques for testing high speed electronic components. The following are examples of such prior art techniques.

U.S. Pat. No. 5,394,403 entitled "Fully Testable Chip Having Self-Timed Memory Arrays" teaches a system in which system debug operations are facilitated by a test mechanism which includes a timing generator circuit which receives an external clock pulse and provides the self-timed clock pulse to a memory array. To prevent unplanned array modification operations from occurring during a shift mode because a bit shifted into a right enable or clear register at the time a clock pulse derived from the timing circuit is generated, a logic means is provided to disable all clock pulses during the shift mode. A separate shift clock pulse is provided during shift mode to shift the test information into control address and data registers.

Although the patent generally refers to disabling a system clock in a self-test mode, the patent does not teach nor suggest the invention as taught and claimed herein specifically with respect to the solving of power dissipation problems during testing of an integrated circuit chip outside its normal operating environment.

U.S. Pat. No. 5,396,170 shows an integrated test architecture which can be used in conformity with the IEEE 1149.1 test standard (JTAG) and configured on a single chip. The architecture of the patent uses the JTAG standard with additional logic on the single chip which permits "at speed" functional test of integrated circuits.

Although the patent discusses tester architecture for testing an integrated circuit "at speed," the patent does not teach nor suggest the present invention as claimed herein with respect to reduction of power dissipation during testing an integrated circuit out of its operating environment.

U.S. Pat. No. 5,381,420 teaches an interface to internal scan paths within an integrated circuit for synchronizing a test clock and a system clock without adversely affecting the operation of either. The system clock drives the test data through the scan path at the system clock rate, the two clocks are decoupled in that they run independently, being synchronized by the interface for clocking the test data into, through, and out of the scan path.

As above, the 420 patent shows an enhancement to the IEEE 1149.1 standard including a decoupled scan path interface. However, the patent does not teach nor suggest the invention as claimed herein.

U.S. Pat. No. 5,329,533 shows a partial scan built-in self-test technique. However, the patent does not teach nor suggest testing with reduced power dissipation and does not teach nor suggest the present invention as claimed herein.

U.S. Pat. No. 5,254,942 is the parent of U.S. Pat. No. 5,396,170 above and contains the same disclosure as the 170 patent. The comments made with respect to the 170 patent apply to the 942 patent as well.

U.S. Pat. No. 5,208,838 teaches a clock multiplier circuit which is selectable to provide either an unmultiplied input clock to the internal clock line or a multiplied clock signal depending upon the state of a test mode input signal. By providing the circuitry on an integrated circuit chip, the chip can be driven at its normal operating frequency using lower frequency test equipment.

Although the patent teaches a selectable multiplier circuit for multiplying a test clock signal to a normal operating frequency signal for a device under test, the patent does not teach nor suggest the present invention as claimed herein.

U.S. Pat. No. 5,181,191 teaches a circuit for transferring data between automatic test equipment and an integrated circuit under test pursuant to a slow clock which can have an arbitrarily long period and for operating storage elements in the integrated circuit pursuant to a fast clock having a short period that corresponds to the clock rate at which combinatorial networks in the integrated circuit are to be tested. Although the patent teaches a first clock having a long period and a second clock having a relatively short period, the patent does not teach nor suggest how the clocks are generated.

The patent does not teach nor suggest the present invention as claimed herein.

U.S. Pat. No. 5,095,262 teaches a high speed electro optic test system for testing high speed electronic devices and integrated circuits using a programmable reference clock source providing clock pulses for accurately timing a stimulus pattern in precise synchronism with optical sampling pulses. Although the patent teaches the testing of high speed electronic devices, the use of the optical sampling pulses in synchronism with a stimulus pattern is not related to the present invention as claimed herein.

U.S. Pat. No. 4,969,148 teaches a serial testing technique for embedded memories including a finite state machine adapted to actuate multiplexor units to connect first bits and for each address output a series of test bits shifting those bits through the addressed word by a series of read and write operations and examining those bits after passage through the address word for defects in the memory circuit at that address. Although the patent teaches a finite state machine for controlling application of signals in a serial testing technique or in embedded memory, the patent does not teach nor suggest the present invention as claimed herein.

U.S. Pat. No. 5,355,369 teaches the testing of high speed core logic circuitry by transferring a test program to a special test data register which downloads the program to the logic circuitry under test and uploads the results. This technique allows the core logic to perform the test at its normal operating speed while still retaining compatibility with the JTAG standard for other tests.

The patent does not teach any special relationship between a test apparatus clock and a system clock. Also, the patent requires a dual ported random access memory and a read-only memory for conducting the tests described in the patent. For these reasons, the patent does not teach nor suggest the present invention as claimed herein.

An article in the *IBM Technical Disclosure Bulletin,* Vol. 33, No. 2, July 1990, at p. 2 and following, describes a logic circuit referred to as COP (common on-chip processor). The COP provides support and control logic needed to achieve built-in self-tests, power on reset, debug, and field support operations at the chip, card, and system levels.

However, there is no intent in the article to perform any power management function. Clock gating is implemented only for the purpose of debugging the chip. The article neither teaches nor suggests the invention as taught and claimed herein as regards reducing power dissipation in a chip during testing outside its operating environment.

An article in the *IBM Technical Disclosure Bulletin*, Vol. 34, No. 11, April 1992, at p. 115 and following, entitled "Inhibiting Large Current Draw on CMOS Chips During LSSD Scan," attacks the problem of power dissipation during testing of CMOS chips by preventing propagation of data scanned through a scan path to the logic of the chip. During a scan, the latches of a scan path are inhibited from allowing changing data to pass out of the latch, thus reducing the amount of switching and thus reducing power requirements.

Although the article generally relates to reduction of power dissipation during testing, the article does not teach nor suggest the present invention as taught and claimed herein.

SUMMARY OF THE INVENTION

Therefore, it is an object of the present invention to reduce power dissipation of an integrated circuit during high speed testing of the integrated circuit out of the operational environment.

It is another object of the present invention to reduce power dissipation of an integrated circuit during high speed testing of the integrated circuit out of the operational environment by controlling a high speed clock signal.

Accordingly, a system for testing a high speed integrated circuit includes apparatus for reducing power dissipation during testing of a high speed electronic component, including a test device, for generating a test clock signal, the test device performing a multiphase test of the high speed electronic component, a circuit for generating a high speed clock signal capable of operating the electronic component at an operational rate, and test control logic for controlling application of the high speed clock signal to circuits on the high speed electronic component to cut off the high speed clock signal during one phase of the multiphase test to reduce power dissipation in the electronic component.

It is an advantage of the present invention that testing of high speed integrated circuits may be accomplished with reduced power dissipation by controlling application of a high speed clock to the chip during scan testing.

Other features and advantages of the present invention will become apparent in the following detailed description of the preferred embodiment of the invention taken in conjunction with the accompanying drawing.

DETAILED DESCRIPTION OF A PREFERRED EMBODIMENT OF THE INVENTION

Figure 1:
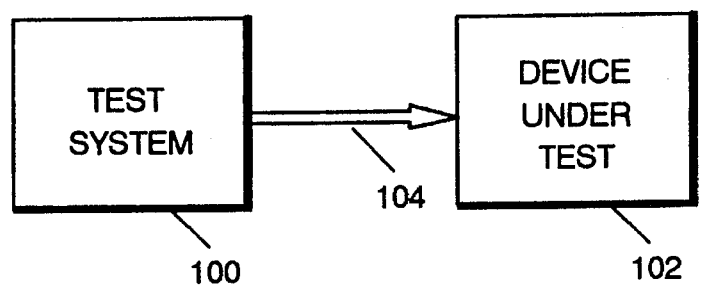
FIG. 1 is a block diagram of the test environment in accordance with the present invention.

Referring now to FIG. 1, a test environment in which the present invention may be employed will be described.

A test system 100 performs tests on device under test (DUT) 102 by sending test signals to DUT 102 over lines 104.

It should be noted that level sensitive scan design (LSSD) testing, although employed with the present invention, is ancillary to the present invention in that the present invention is directed primarily to solving the problem of testing a high speed device with a test system while reducing power dissipation in the DUT 102.

Figure 2:
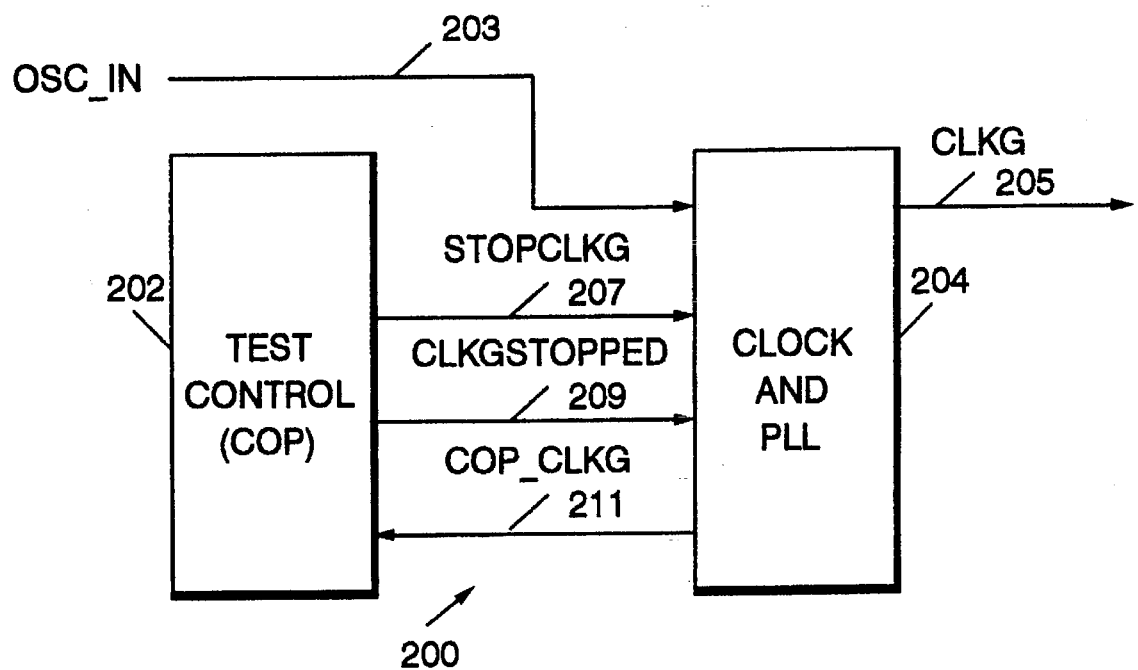
FIG. 2 is a block diagram showing the clock control logic in accordance with the present invention.

Referring now to FIG. 2, clock control logic 200 in accordance with the present invention will be described. A test control logic circuit 202 as described in the *IBM Technical Disclosure Bulletin* article, Vol. 33, No. 2, July 1990, at pp. 2–8, inclusive, referred to above in the Background of the Invention, generally describes a common on-chip processor (COP). The referenced *IBM Technical Disclosure Bulletin* article is hereby incorporated by reference with respect to the COP.

The present invention represents an improvement over the TDB article in that test control logic 202 has added controls for controlling application of a high speed system clock CLKG. An input signal on line 203 to on-chip clock and phase lock loop circuit 204 is the source from which the output CLKG is generated.

The application of CLKG 205 is controlled by the STOP-CLKG signal which is output of test control logic 202 on line 207 and input to clock and PLL circuit 204 and the handshaking response signal CLKGSTOPPED on line 209 which the clock in PLL circuit 204 returns to the test control logic 202. Clock and PLL circuit 204 also provide a clocking signal COP_CLKG on line 211 to test control logic 202.

Testing of high speed electronic component DUT 102 is divided into multiple phases. One of these phases is referred to as the scan phase which represents about 99% of the time of a single test cycle. A second testing phase in the multiphase test operation is referred to as the system test cycle.

During the scan phase, it is not necessary to have CLKG running at operational speed (for example, 320 Mhz) and causing a high power dissipation in DUT 102. It is only necessary to have CLKG running during the system test phase.

Therefore, the preferred embodiment of the present invention, by stopping CLKG during the scan phase of the test cycle, greatly reduces power dissipation in the DUT 102.

As an example, if a total test cycle takes 812,500 nanoseconds to complete, the scan test phase of the test cycle might take approximately 812,400 nanoseconds, whereas the system cycle test phase might take approximately 100 nanoseconds to complete for each test cycle. This means that if the average power dissipated during the system phase of a test cycle is approximately 70 watts, and the average power dissipated during the scan phase is 0.30 watts, the average dissipated power in DUT 102 would equal approximately 0.32 watts.

Figure 3:
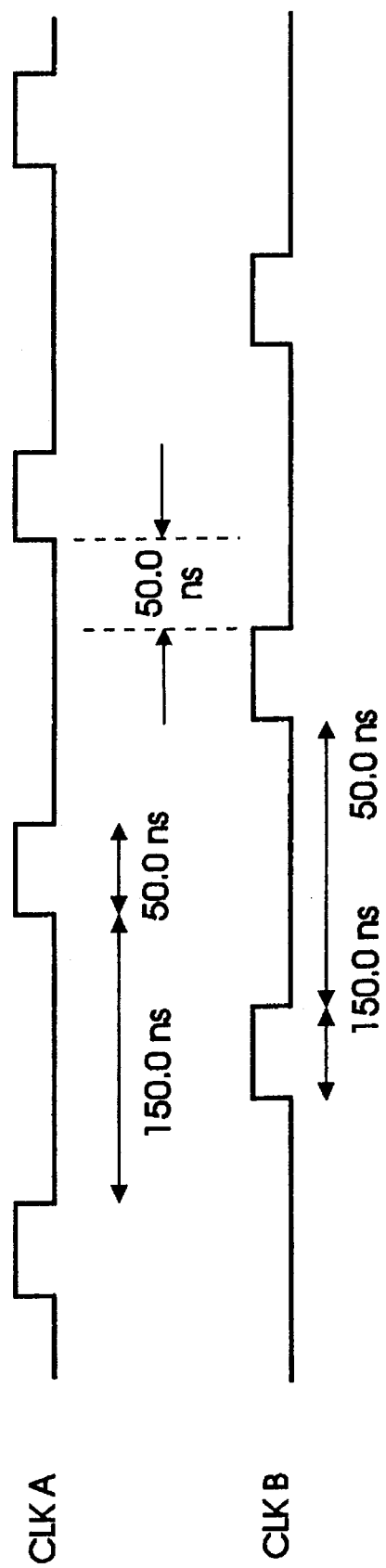
FIG. 3 is a timing diagram showing selected clock signals in accordance with the present invention.

Referring now to FIG. 3, a second aspect of the preferred embodiment of the present invention will be described.

Timing during the scan phase of the test cycle is controlled by a master clock generally referred to as CLKA and a slave scan clock CLKB. By controlling CLKA and CLKB such that there is a "dead clock" interval between CLKA and CLKB, the average power dissipation during the scan phase of the test cycle is also reduced. In FIG. 3, both CLKA and CLKB are running at a frequency of 5 Mhz (clock period of 200 ns.), having a clock on pulse of 50 ns and an off time of 150 ns per cycle. The dead clock interval between CLKA and CLKB is set to approximately 50 ns to reduce average power dissipation in DUT 102 during the scan phase.

Figure 4:
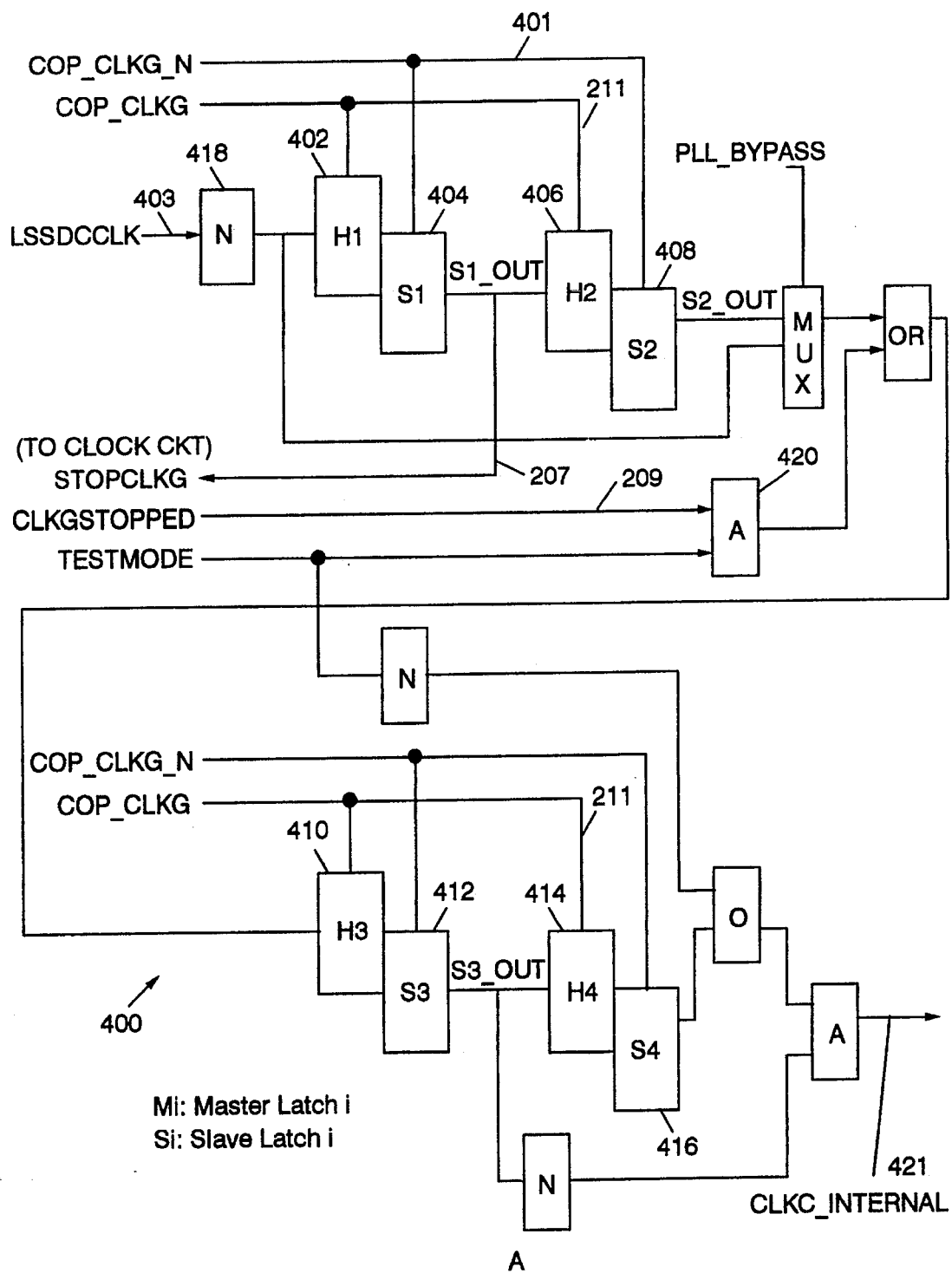
FIG. 4 is a logic diagram of a common on-chip processor (COP) control logic in accordance with the present invention.

Referring now to FIG. 4, the COP control logic in accordance with the preferred embodiment of the present invention will be described.

Control logic 400, clock signal COP_CLKG on line 211, and the inverse COP_CLKG_N on line 401 generated by clock logic 204 (see FIG. 2) are free running versions of global CLKG which operate the CLKG COP control logic 400.

Clock signal COP_CLKG clocks master latches 402, 406, 410, and 414, respectively. The inverse COP clock signal COP_CLKG_N on line 401 clocks slave latches 404, 408, 412, and 416. The timing for clock signal COP_CLKG is shown in FIG. 5.

Figure 5:
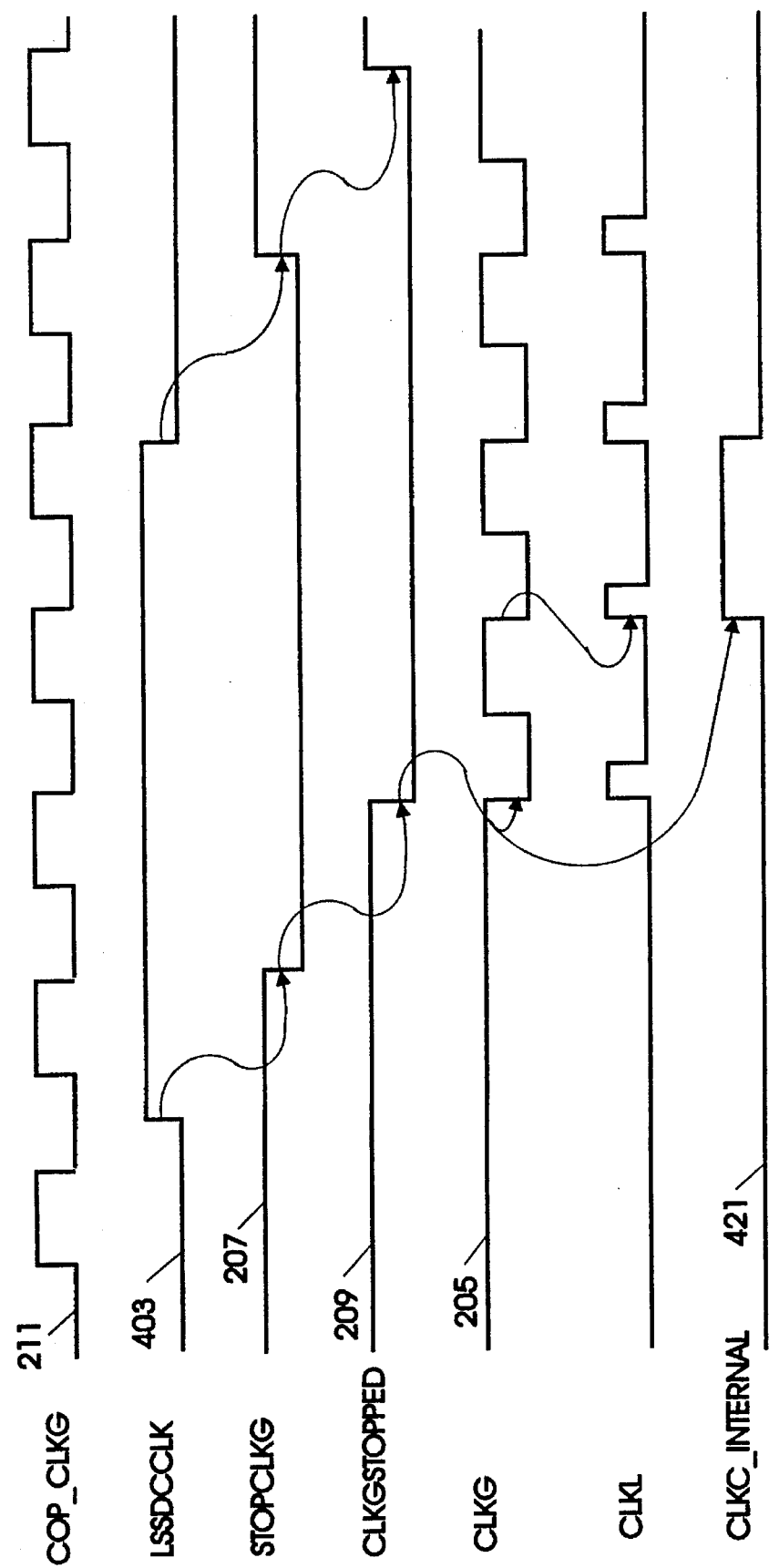
FIG. 5 is a timing diagram showing finite state machine input and output clock signals in accordance with the present invention.

The rising edge of asynchronous scan clock LSSDCCLK on line 403 is detected (see FIG. 5). The rising edge of LSSDCCLK is synchronized with respect to clock signal COP_CLKG 211. Also, the rising edge of LSSDCCLK activates a request to drop the STOPCLKG signal on line 207 through inverter 418 and latches 402 and 404. (See FIG. 5.) The fall of the STOPCLKG signal on line 207 allows the clock logic 204 to start CLKG on line 205. No pulse is generated for CLKC_INTERNAL on lines 421 until the CLKGSTOPPED signal on line 209 is received by AND 420. A second input to AND 420 is the test mode signal which indicates that the circuit is operating in a test mode as opposed to an operational mode. It is assumed during the multiphase testing in accordance with the present invention that the test mode signal will be active.

It can be seen from the timing diagram of FIG. 5 that the CLKC_INTERNAL signal on line 421 does not generate a pulse until the rising edge of launch clock CLKL following the receipt of the acknowledgment signal CLKGSTOPPED on line 209. (A description of the operation of launch clock CLKL is contained in co-pending patent application Serial No. 08/XXX,XXX AA9-95-036).

Launch clock signal CLKL is a relatively short duration pulse clock signal running at the same speed as global CLKG where the short duration pulse is generated by the falling edge of CLKG (see FIG. 5). When the LSSDCCLK signal on line 403 drops, the STOPCLKG signal on line 207 is raised which signals clock logic 204 to stop CLKG.

Figure 6:
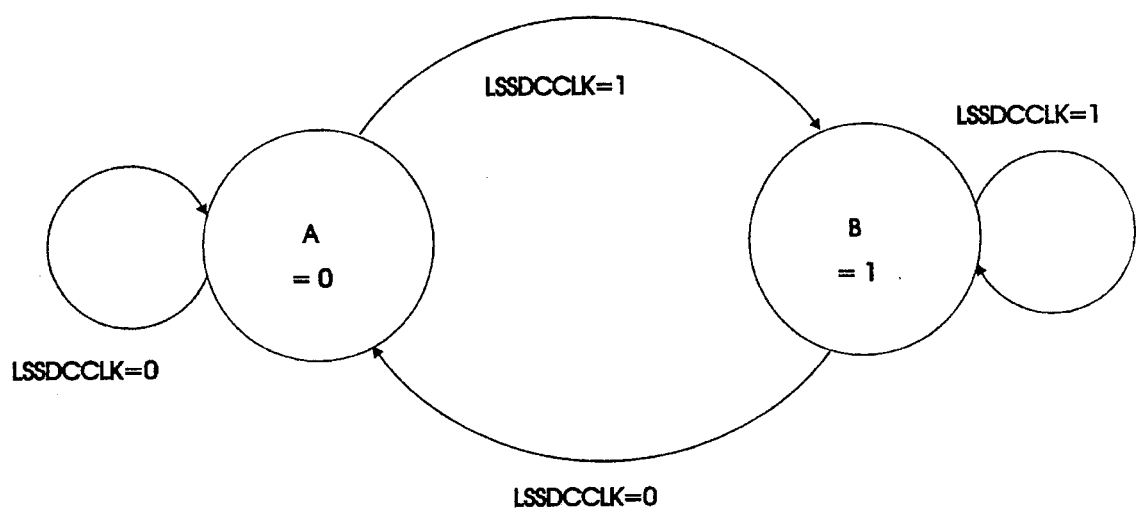
FIG. 6 is diagram of the COP finite state machine in accordance with the present invention.

Referring now to FIG. 6, the state diagram of the COP finite state machine controlling CLKG will be described. When state A is active, STOPCLKG is also active. If state B is active, then STOPCLKG is inactive. Assuming that the LSSDCCLK signal is inactive and the finite state machine is in state A, if the LSSDCCLK signal is raised, the finite state machine switches from state A to state B causing the STOPCLKG signal to drop, allowing CLKG to be generated for the system test phase of a multiphase test. If the finite state machine is in state B, with STOPCLKG inactive, if the LSSDCCLK signal drops, the finite state machine switches back to state A, causing the STOPCLKG signal to be raised, thus stopping the generation of global CLKG during the scan phase of the multiphase test.

Figure 7:
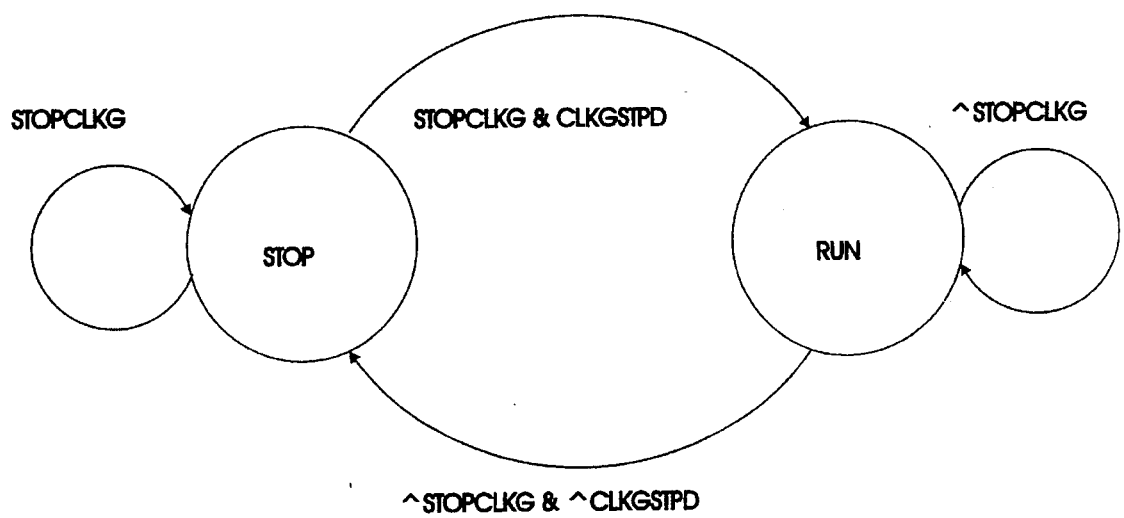
FIG. 7 is diagram of the CLKG STOP/RUN finite state machine in accordance with the present invention.

Referring now to FIG. 7, the finite state machine of the CLKG run/stop finite state machine will be described. Assuming that CLKG is in a stopped state, the STOPCLKG signal is active. If the STOPCLKG signal becomes inactive and the CLKGSTOPPED signal is inactive, the finite state machine switches from the CLKGSTOP to CLKGRUN state. CLKG will be running as long as the STOPCLKG signal is inactive.

As described above, when STOPCLKG and CLKGSTOPPED signals are both active, the finite state machine switches to the CLKGSTOP state. When the finite state machines is in the stop state, CLKG has a steady state value of 1.

It will be appreciated that although a specific embodiment of the present invention has been described herein for the purposes of illustration, various modifications may be made without departing from the spirit or scope of the invention.

Accordingly, the scope of this invention is limited only by the following claims and their equivalents.

What is claimed is:

1. Apparatus for reduced power dissipation testing a high speed electronic component, comprising:

a test device, for generating a test clock signal having a first frequency, said test device performing a multiphase test of said high speed electronic component;

means for generating a second frequency clock signal capable of operating said electronic component at a predetermined high speed rate; and test control logic for controlling application of said second frequency test clock signal to circuits on said high speed electronic component to stop said second frequency clock signal during one phase of said multiphase test to reduce power dissipation in said electronic component.

2. Apparatus for testing a high speed electronic component, according to claim 1, wherein said multiphase test comprises a scan test phase and a system test phase.

3. Apparatus for testing a high speed electronic component, according to claim 1, wherein said test control logic further comprises:

means responsive to a test phase signal for stopping a system clock signal from being applied to said high speed electronic component.

4. Apparatus for testing a high speed electronic component, according to claim 2, wherein said test control logic further comprises:

means for reducing the frequency of a scan clock during said scan phase.

5. Apparatus for testing a high speed electronic component, according to claim 2, wherein said test control logic further comprises:

means for inserting a dead clock interval between pulses of a first scan clock signal and a second clock signal.

6. A method for reducing power dissipation in a high speed electronic component during a test of said high speed electronic component, comprising the steps of:

generating a test phase signal indicating which phase of a multiphase test is to be performed on said high speed electronic component;

stopping application of a first clock signal to said high speed electronic component during a first phase of said multiphase test; and allowing application of a first clock signal to said high speed electronic component during a second phase of said multiphase test.

7. A method, according to claim 6, wherein said stopping step further comprises the steps of:

generating a stop clock signal in response to said test phase signal; and receiving an acknowledgement signal indicating that said stop clock signal was received by a clock generation circuit.

8. A method, according to claim 6, further comprising the step of:

reducing a frequency of a scan clock signal during a first test phase.

9. A method, according to claim 6, further comprising the step of:

inserting a dead clock interval between pulses of a first scan clock signal and a second clock signal to reduce power dissipation in said high speed electronic component.

\* \* \* \* \*